United States Patent
Smith et al.

(10) Patent No.: US 7,591,924 B2
(45) Date of Patent: Sep. 22, 2009

(54) APPARATUS FOR SEALING FLEX CIRCUITS HAVING HEAT SENSITIVE CIRCUIT ELEMENTS

(75) Inventors: C. W. Sinjin Smith, Palm Bay, FL (US); Charles M. Newton, Palm Bay, FL (US); Paul B. Jaynes, Indialantic, FL (US)

(73) Assignee: Harris Corporation, Melbourne, FL (US)

(*) Notice: Subject to any disclaimer, the term of this patent is extended or adjusted under 35 U.S.C. 154(b) by 379 days.

(21) Appl. No.: 11/463,087

(22) Filed: Aug. 8, 2006

(65) Prior Publication Data
US 2006/0286189 A1 Dec. 21, 2006

Related U.S. Application Data

(62) Division of application No. 11/050,303, filed on Feb. 3, 2005, now Pat. No. 7,128,801.

(51) Int. Cl.
*B30B 15/34* (2006.01)
(52) U.S. Cl. .............. 156/583.1; 156/583.3; 156/583.4; 100/305
(58) Field of Classification Search ........... 156/311, 156/580, 583.1, 583.3, 583.4, 583.6, 583.8; 100/305, 318, 325, 326; 425/407
See application file for complete search history.

(56) References Cited

U.S. PATENT DOCUMENTS

| | | | | |
|---|---|---|---|---|
| 4,854,026 | A | * | 8/1989 | Averdick et al. ......... 29/890.03 |
| 5,108,672 | A | * | 4/1992 | Sasaki et al. ............... 264/40.5 |
| 5,496,433 | A | * | 3/1996 | Miyashita et al. ........... 156/358 |
| 5,827,999 | A | | 10/1998 | McMillan et al. |
| 5,993,593 | A | | 11/1999 | Swartz et al. |
| 6,320,257 | B1 | | 11/2001 | Jayaraj et al. |
| 2002/0079053 | A1 | * | 6/2002 | Tanaka et al. ............ 156/308.2 |
| 2002/0189755 | A1 | | 12/2002 | Calmidi et al. |
| 2003/0207048 | A1 | | 11/2003 | St. Lawrence et al. |
| 2004/0010910 | A1 | | 1/2004 | Farrell et al. |
| 2004/0012083 | A1 | | 1/2004 | Farrell et al. |

* cited by examiner

*Primary Examiner*—John L Goff
(74) *Attorney, Agent, or Firm*—GrayRobinson, P.A.

(57) ABSTRACT

A method and apparatus is disclosed for affixing a cover layer formed of liquid crystal polymer to a flex circuit consisting of circuit elements mounted to a liquid crystal polymer substrate in order to encapsulate the circuit elements between the cover layer and substrate to protect them from exposure to moisture and contaminants and to provide thermal protection of temperature sensitive circuit elements within the flex circuit during the encapsulation process.

19 Claims, 6 Drawing Sheets

APPARATUS FOR SEALING FLEX CIRCUITS HAVING HEAT SENSITIVE CIRCUIT ELEMENTS

This application is a divisional of U.S. application Ser. No. 11/050,303, filed on Feb. 3, 2005 now U.S. Pat. Ser. No. 7,128,801.

FIELD OF THE INVENTION

This invention is directed to flexible circuits, and, more particularly, to a method and apparatus for sealing circuit elements of a flexible circuit, including heat sensitive circuit elements, which are mounted on a substrate formed of liquid crystal polymer to protect them from exposure to moisture and contaminants.

BACKGROUND OF THE INVENTION

Flexible or "flex" circuits are used in a wide variety of applications where an electrical circuit must bend around corners or be flexed during operation. Flex circuits are thin, light weight, flexible and exhibit high routability. Traditionally, polyimide films have been used as substrates in the manufacture of flex circuits due to their good thermal stability and mechanical strength. Other properties of polyimide films, however, limit the speed or frequency at which electric components mounted thereto can operate.

Liquid crystal polymer ("LCP") has been developed in recent years as a replacement for polyimide films in flex circuits. LCP is a thermoplastic aromatic polyester which is thermally stable, with an upper use temperature in excess of 250° C. and good inherent flame retardant properties. LCP films, in comparison to polyimide films, have about one-tenth of the moisture uptake and a lower coefficient of humidity expansion. Lower moisture absorption leads to higher frequency signal and data processing stability. Additionally, LCP films have a lower dielectric constant and a lower loss or dissipation factor over the functional frequency range of 1 kHz to 45 GHz, with negligible moisture effects, compared to polyimide films.

The fabrication of flex circuits with LCP films is expected to lead to their use in more demanding environments where moisture and other contaminants are prevalent. Particularly in such types of applications, the circuit elements applied to the LCP substrate of the flex circuit must be protected from damage. Soldermask coatings, which have been employed to provide protection from moisture and contaminants in polyimide films, have been considered for use with LCP substrates. Additionally, due to the thermoplastic nature of LCP, the application of an LCP film cover layer to an LCP substrate has been proposed as a means of encapsulating circuit elements. With respect to LCP cover layers, current practice is to employ an air knife or laser to create localized heating of the LCP cover layer and LCP substrate along the periphery of the flex circuit. A number of problems can arise from this approach. A failure of the seal between the cover layer and substrate at any point along the periphery of the flex circuit can expose all of the circuit elements to moisture, chemicals or other contaminants. If the air between the cover layer and substrate is not fully removed, pressurization of the flex circuit which would occur in underwater applications, for example, could compress such air and create a bubble potentially resulting in a rupture of the cover layer and/or substrate thus creating a failure of the entire circuit.

The melt temperature of LCP material is approximately 283° C., and soldermask coatings are also applied at relatively high temperatures. While a number of standard circuit elements are not affected by high temperatures, components such as micro-electrical-mechanical-system ("MEMS") sensors, infra-red sensors and a variety of other circuit elements are temperature sensitive and can be damaged or destroyed upon exposure to elevated temperatures. There is a need for an efficient and dependable method and apparatus capable of individually sealing or encapsulating the electrical components of circuits which employ an LCP substrate, while protecting heat sensitive components of the circuit from damage due to the temperatures at which the sealing process is performed.

SUMMARY OF THE INVENTION

This invention is directed to a method and apparatus for affixing an LCP cover layer to a flex circuit consisting of circuit elements mounted to an LCP substrate, at least some of which are temperature sensitive, in order to individually protect the circuit elements from damage and/or reduced operational efficiency due to the presence of moisture, chemical and other contaminants.

In the presently preferred embodiment, the apparatus includes an iso-static press having a hollow interior connected to a source of oil or other liquid whose temperature can be accurately controlled and maintained. The oil is heated to a temperature in the range of approximately 283° C. to 320° C. and transferred from a reservoir into the interior of the press. The base of the press has a plate or membrane formed of a flexible material covered with a non-stick surface which does not adhere to LCP.

The flex circuit is placed on the surface of the thermally conductive top plate of a support such that the circuit elements are exposed. A thermal insulating compound may be placed over each temperature sensitive circuit element for added thermal protection. The support includes a housing formed with a cavity within which a number of conduits are mounted each having an upper end communicating with a channel formed in the underside of the top plate. Cooling fluid from a source is circulated through selected conduits, i.e. those which are located beneath the temperature sensitive circuit elements of the flex circuit, to provide localized cooling of such elements during the lamination process. Other conduits, which are not located near the temperature sensitive circuit elements, may be supplied with a heating fluid to raise the temperature of the top plate of the support in selected areas and thus assist with the lamination process.

With the flex circuit in place on the top plate of the support, and the conduits within the support receiving cooling fluid or heating fluid to cool or heat selected areas of the top plate, an LCP cover layer is placed atop the flex circuit and the press is activated to move into contact with the cover layer. The flexible membrane at the base of the press is capable of substantially conforming to the shape of the circuit elements, thus urging the LCP cover layer around each of them individually to the underlying LCP substrate of the flex circuit. The temperature and pressure applied by the press, and the elevated temperature of selected areas of the support top plate, are sufficient to cause the LCP cover layer and substrate to "relax" or melt to a limited extent and thus adhere together forming a secure bond so that the circuit elements are individually encapsulated between the two layers.

BRIEF DESCRIPTION OF THE DRAWINGS

The structure, operation and advantages of the presently preferred embodiment of this invention will become further apparent upon consideration of the following description, taken in conjunction with the accompanying drawings, wherein.

DETAILED DESCRIPTION OF THE INVENTION

Figures 1, 1A:
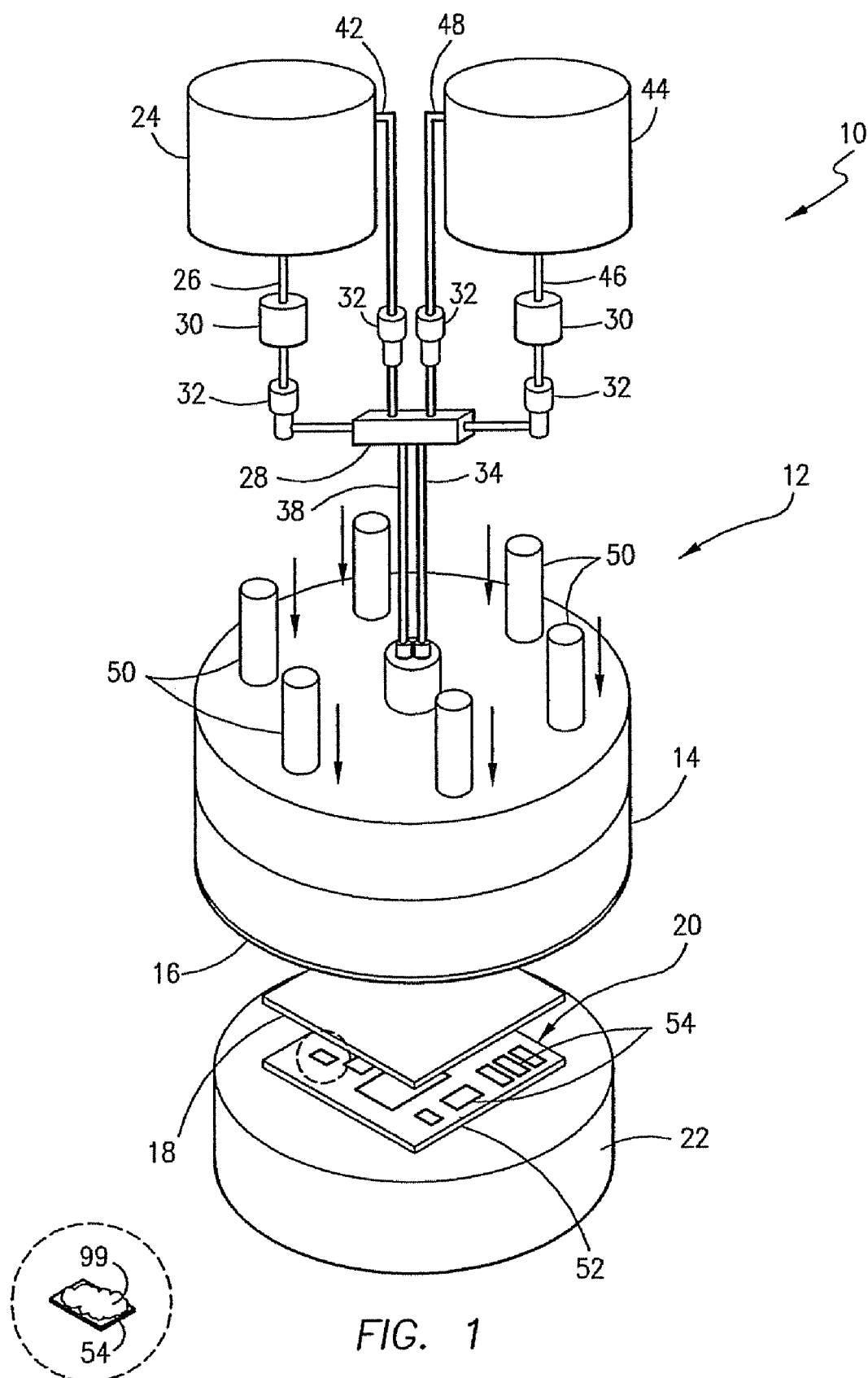
FIG. 1 is a schematic, perspective view of the apparatus of this invention.
FIG. 1A is an enlarged view of the encircled portion of FIG. 1.

Referring now to the Figs., the apparatus 10 of this invention is schematically illustrated. The apparatus 10 includes an iso-static press 12 having a housing 14 formed with a hollow interior. The base of the housing 14 mounts a flexible membrane 16 having an exposed surface coated with Teflon® or other release agent which will not stick to LCP, and an inside surface coated with a hydrophobic film. Preferably, the flexible membrane 16 is formed of high density polyethylene, butyl rubber, ethylene propylene diene monomer rubber or a similar material.

The press 12 is operative to apply heat and pressure against a cover layer 18 which overlies a flex circuit 20 placed upon a support 22. In the presently preferred embodiment, the press 12 is heated by the introduction into its hollow interior of heated oil or a similar fluid whose temperature can be relatively accurately controlled and maintained within the range of about 283° C. to 320° C. A first reservoir 24 having heating elements (not shown) is connected by a supply line 26 to a manifold 28. A pump 30 and valve 32 are located in the supply line 26, between the first reservoir 24 and manifold 28, as shown. The manifold 28, in turn, is connected by an input line 34 to one port at the top of the press 12, and by an output line 38 to a second port. A recirculation line 42, containing a valve 32, is connected between the manifold 28 and the top of the first reservoir 24.

In view of the relatively high temperature obtained by the press 12 during operation, it is advantageous to provide a cooling capability to step the temperature down. To that end, a second reservoir 44 is provided which contains the same fluid as first reservoir 24 except at ambient temperature. The bottom of second reservoir 44 is connected by a line 46 to the manifold 28, and a recirculation line 48 connects the manifold 28 to the top of the second reservoir 44. A pump 30 and valve 32 are located in the line 46 between the second reservoir 44 and manifold 28, and a valve 32 is mounted in the recirculation line 48.

The press 12 is moved with respect to the support 22 by a number of pneumatic or hydraulic pistons 50 which are mounted at equal intervals along the top surface of the press 12. Conventionally, the pistons 50 are independently actuated by a source of air or fluid (not shown) to ensure that the press 12 applies uniform pressure to the cover layer 18 and flex circuit 20 over the entire surface area of the flexible membrane 16. The detailed construction of the press 12 forms no part of this invention, and is therefore not discussed further herein.

As discussed above, the method and apparatus 10 of this invention are designed to provide a means for individually encapsulating circuit elements to protect them from moisture and contaminants. The flex circuit 20 consists of a substrate 52 formed of LCP—upon which a number of circuit elements 54 are mounted. The cover layer 18 is also formed of LCP, which, because of its thermoplastic nature, will "relax" or begin to melt at a temperature of about 283° C. By placing the cover layer 18 over the flex circuit 20 and applying heat and pressure, the cover layer 18 and substrate 52 adhere to one another with a secure bond and entirely enclose the circuit elements 54 between them.

At least some of the circuit elements 54 are temperature sensitive and would be damaged by exposure to heat on the order of the melt temperature of the LCP layers. The support 22 is constructed to provide localized cooling of the temperature sensitive circuit elements 54, and to generate heat in other areas of the substrate 52 which raises its temperature to assist with the lamination or encapsulation process. With reference now to FIGS. 3-7, the support 22 includes a side wall 56 defining an internal cavity 58 which is closed by a top plate 60 and a bottom plate 62. The top plate 60 is preferably formed of a highly thermally conductive material such as aluminum silica carbide. A number of channels 64 are machined or otherwise formed in the underside of the top plate 60, each of which mounts a conduit 66. See FIG. 7. The conduits 66 are depicted in the Figs. as a pair of side-by-side pipes 68 and 70 each having an upper end received within a channel 64 in the top plate 60 so that fluid can pass between the two. It should be understood, however, that the conduit 66 may be a unitary structure formed with an internal wall so as to define two separate flow paths, for purposes to become apparent below.

Figure 4:
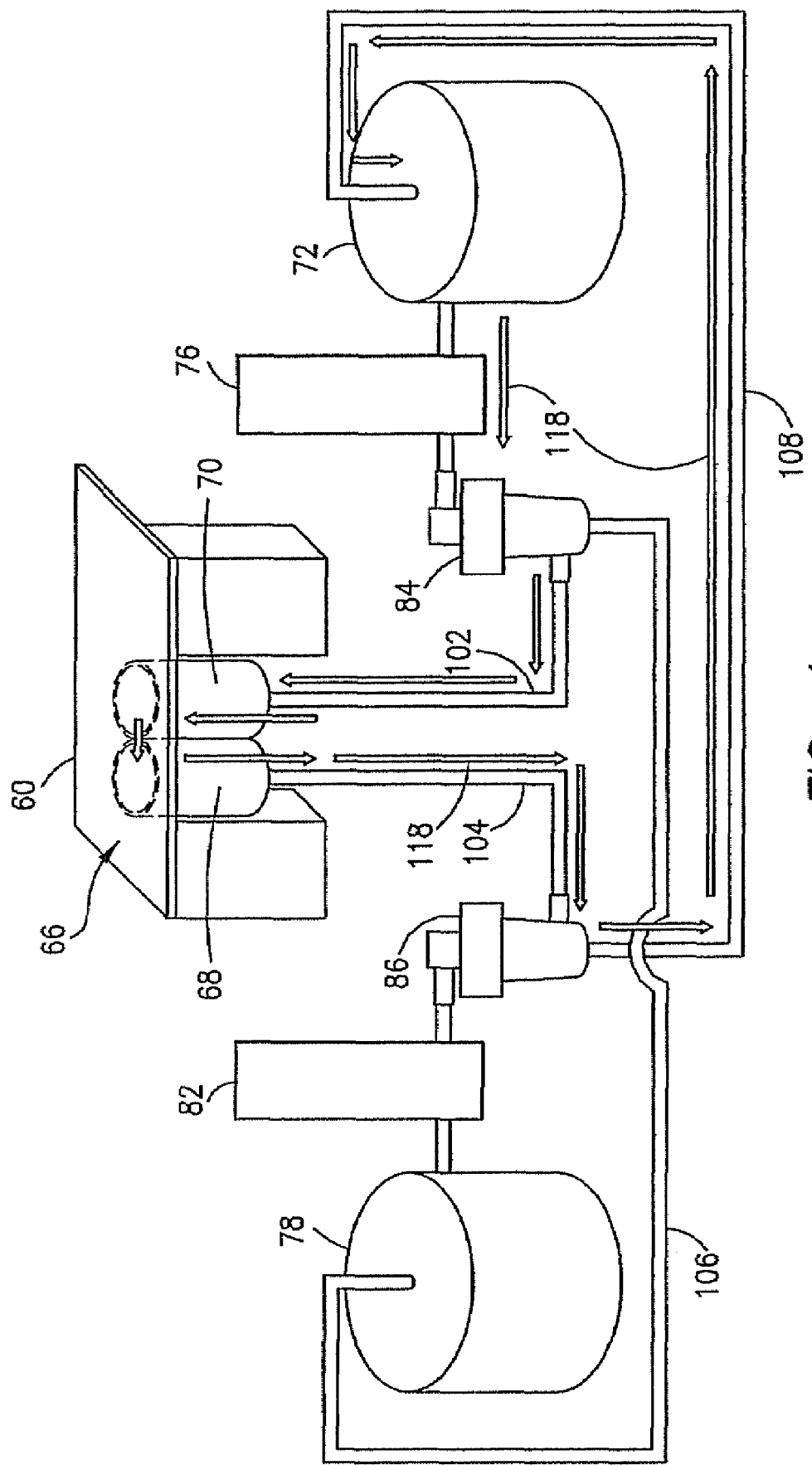
FIG. 4 is a schematic view of one conduit of the support connected by 3-way valves to a hot fluid source and a cold fluid source, wherein cooling fluid is being supplied to the conduit.
Figure 5:
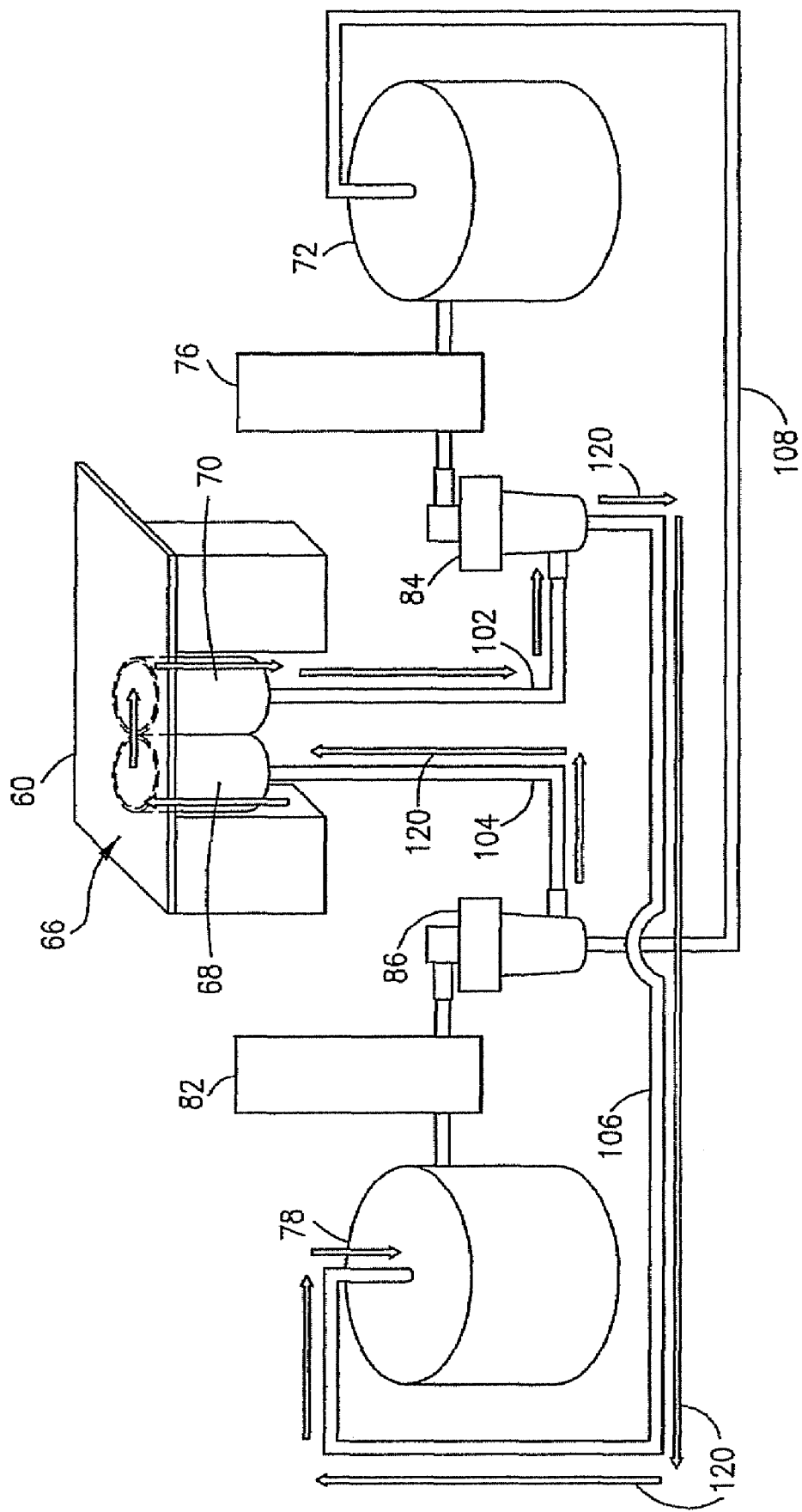
FIG. 5 is a view similar to FIG. 4, except with hot fluid being supplied to the conduit.
Figure 6:
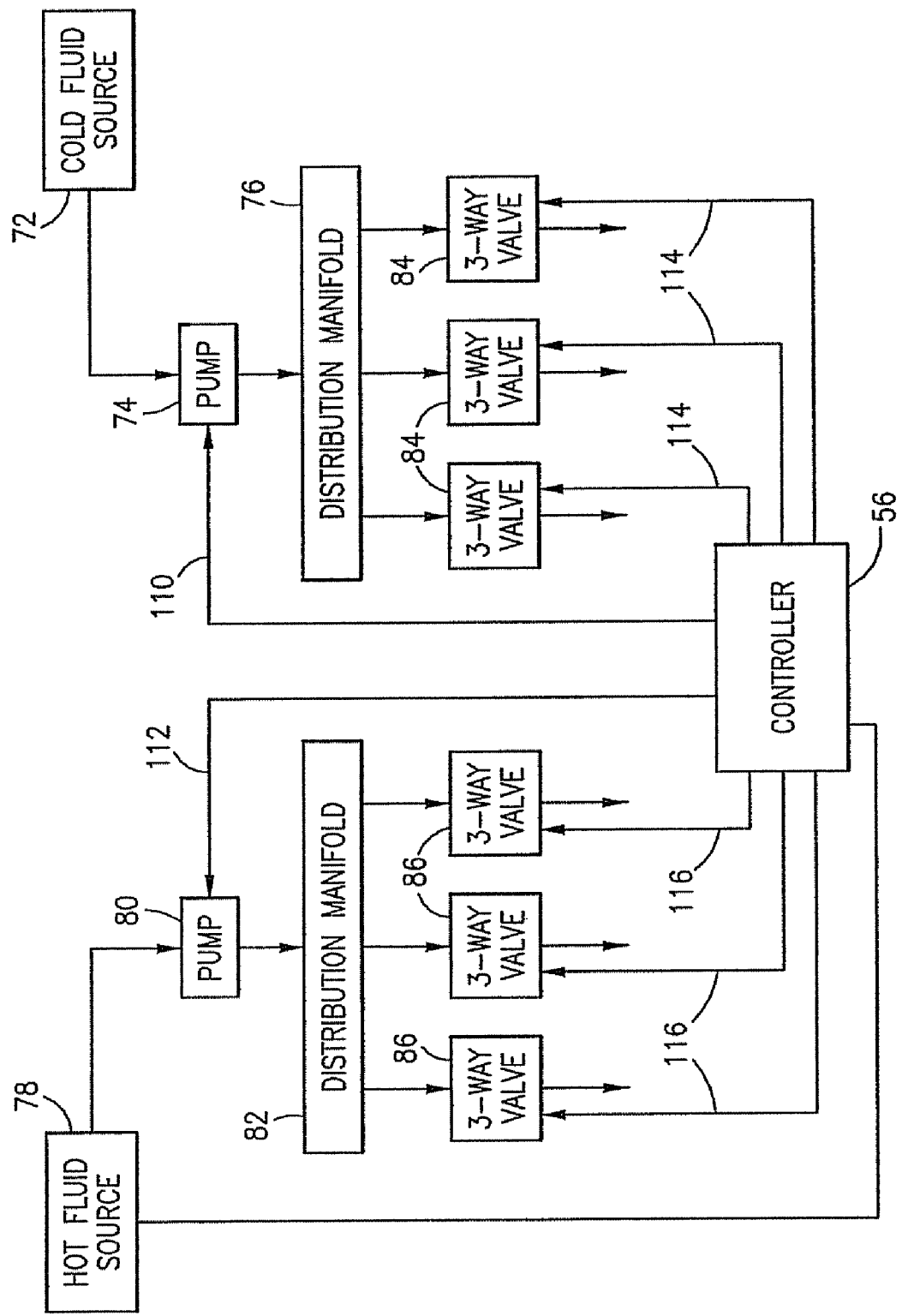
FIG. 6 is a schematic, block diagram depicting the structure for supplying hot fluid and cooling fluid to the conduit.
Figure 7:
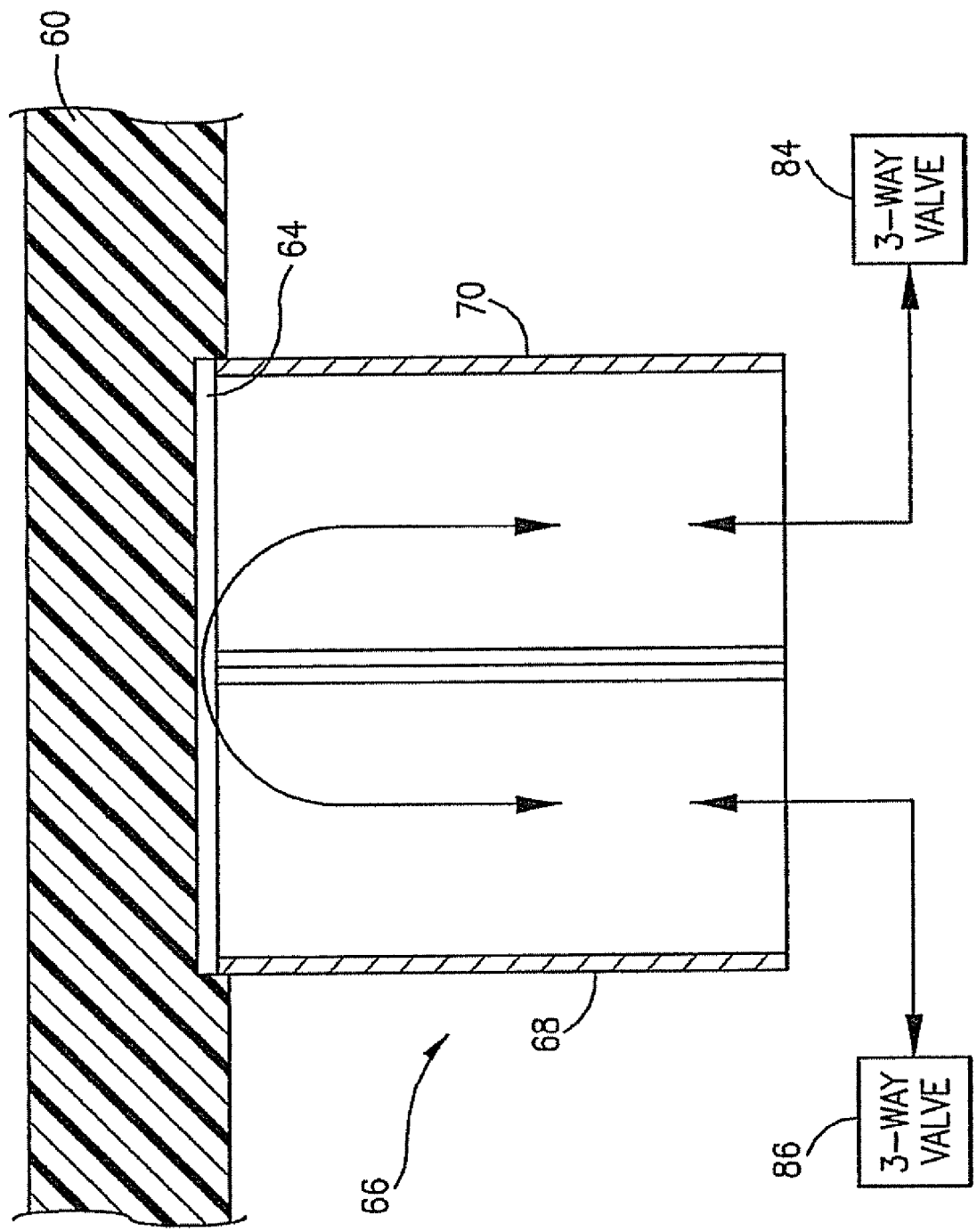
FIG. 7 is a cross sectional view of the connection between a conduit and the top plate of the support.

An array of conduits 66 is carried within the cavity 58 of the support 22 atop the bottom plate 62 and extending beneath substantially the entire surface area of the top plate 60. Structure is provided to transmit either cold fluid or hot fluid into each conduit 66, depending on the position of the temperature sensitive circuit elements 54 resting on the top plate 60 of the support 22, so that such fluid produces localized heating or cooling of the top plate 60. As best seen in FIGS. 4-6, this structure includes a cold fluid source 72 connected to a pump 74, which, in turn, is connected to a distribution manifold 76 and, a hot fluid source 78 connected by a pump 80 to a second distribution manifold 82. While the "hot" fluid source 78 is shown as a separate reservoir in the Figs., it is contemplated that the first reservoir 24 supplying heated fluid to the press 12 may be employed to transmit hot fluid to the conduits 66, if desired.

As described more fully below in connection with a discussion of the operation of the apparatus 10 of this invention, the distribution manifold 76 connected to the cold fluid source 72 transmits such fluid to number of 3-way valves 84. Each 3-way valve 84, in turn, is connected to the inlet of the pipe 70 of a conduit 66. Similarly, the distribution manifold 82 receiving hot fluid from source 78 is connected to a number of 3-way valves 86, each of which connects to the inlet of a pipe 68 of a conduit 66. Consequently, depending upon the operative position of the 3-way valves 84 and 86, either hot or cold fluid can be circulated through each conduit 66 to obtain localized heating or cooling of the top plate 60 in the area located immediately above such conduit 66.

The operation of the press 12 of this invention is described initially below, followed by a discussion of the localized cooling and heating provided by the support 22.

Figure 2:
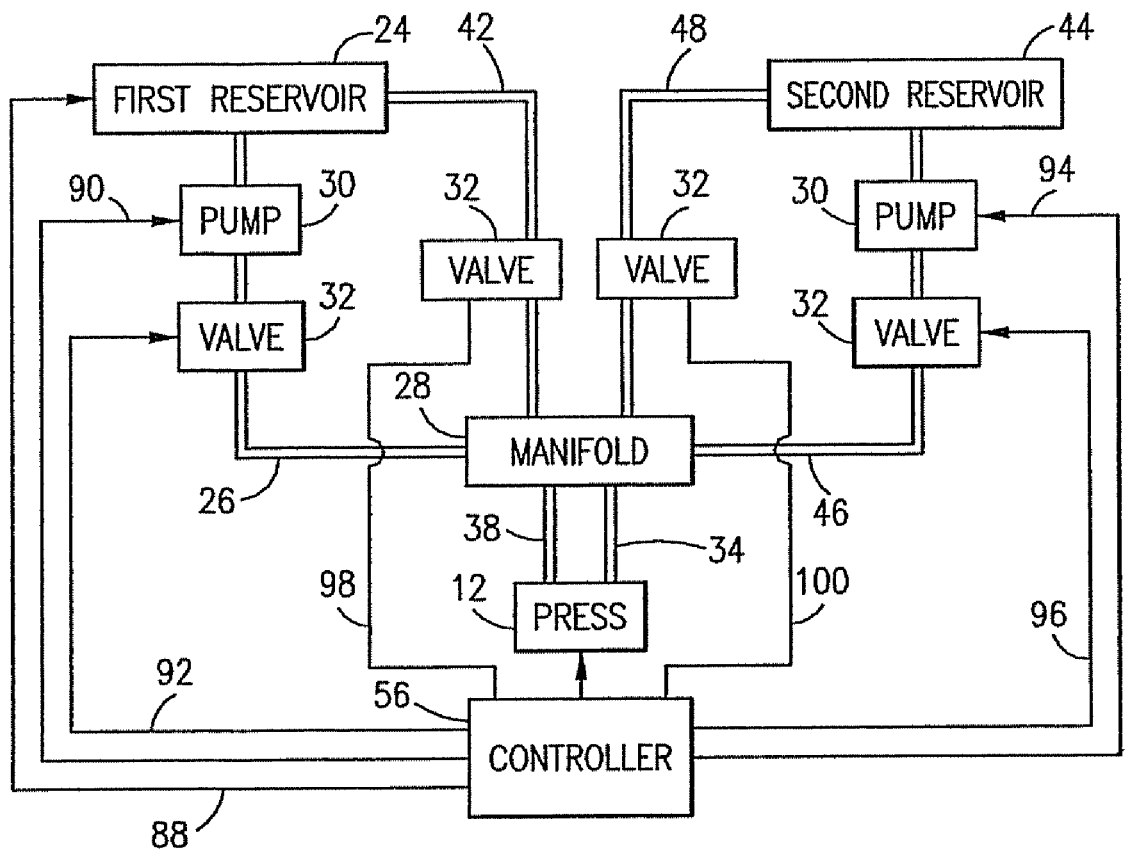
FIG. 2 is a block diagram illustrating the operation of the press of the apparatus shown in FIG. 1.
Figure 3:
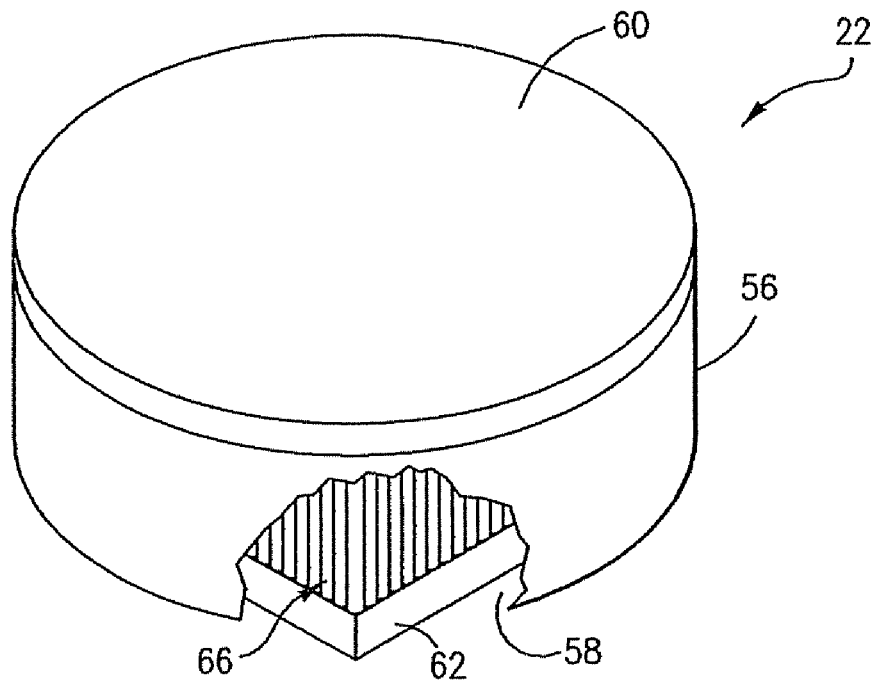
FIG. 3 is a perspective view of the support for the flex circuit with a portion cut away to show the conduits mounted within a cavity in the support.

The apparatus 10 is operated by a commercially available controller 56 as schematically depicted in the block diagrams of FIGS. 2 and 6. Initially, oil or other fluid within the first reservoir 24 is brought up to a temperature in the range of 283° C. to 320° C. by activating heating elements (not shown) therein. The controller 56 is operative to activate the heating elements via a signal input through lead 88, or they may be independently activated by a switch (not shown) located at the first reservoir 24. The controller 56 then inputs signals through leads 90 and 92 to start the pump 30 and open valve 32, respectively, thus initiating the flow of heated oil out of the first reservoir 24. When it is desired to heat the press 12 in preparation for circuit encapsulation, the controller 56 deactivates the pump 30 and valve 32 in line 46 from second reservoir 44 by signals input through leads 94 and 96, respectively. The heated oil flows to the press 12 through the manifold 28 and into the input line 34 leading into the interior of the press 12. Preferably, the temperature of the heated oil within the press 12 is controlled and maintained by continuously recirculating it from the first reservoir 24 through the manifold 28 and input line 34 into the press 12, and then out of the press 12 through the output line 38 and manifold 28 to the recirculation line 42 connecting the manifold 28 to the first reservoir 24. The controller 56 opens the valve 32 within the recirculation line 42 via a signal through the line 98 to allow heated oil to pass from the manifold 28 into the first reservoir 24.

With the press 12 at the appropriate temperature, the encapsulation process can proceed. The flex circuit 16 is positioned on the support 22 so that the circuit elements 54 on the LCP substrate 52 are exposed. In the presently preferred embodiment, a thermal insulating compound 99 such as Aerogel or a silica based material is placed over the top of each temperature sensitive circuit element 54. See FIG. 1A. The compound 99 is effective to assist in preventing thermal damage to the upper portion of such circuit elements during the encapsulation operation. The LCP cover layer 18 is then placed atop the substrate 52 and circuit elements 54. The controller 56 operates the pistons 50 causing the press 12 to move toward the support 22. Upon engagement of the flexible membrane 16 at the bottom of the press 12 with the cover layer 18, at a uniform pressure up to 200 psi, the flexible plate 16 substantially conforms to the shape of the circuit elements 54 beneath. In turn, the cover layer 18 is forced around the circuit elements 54 into contact with substrate 52. The press 12 is maintained in this position for a period of time sufficient to heat both the LCP cover layer 18 and LCP substrate 52 to a melt temperature of at least 283° C., but not more than about 320° C., causing them to bond to one another and thus encapsulate the circuit elements 54 between the two.

After completing one or more encapsulation procedures, the temperature of the press 12 may be stepped down by circulating comparatively cool, ambient temperature oil into the press 12 from the second reservoir 44. The controller 56 is operative to deactivate the pump 30 and close valve 32 within line 26 connected to the first reservoir 24, while activating pump 30 and opening valve 32 within the line 46 connected to the second reservoir 44. The controller 56 closes the valve 32 within the recirculation line 42, and then opens the valve 32 within the recirculation line 48 extending from the manifold 28 to the second reservoir 44 by inputting a signal to such valve 32 through a line 100. As a result, ambient temperature oil is recirculated within the press 12 to reduce its temperature.

As noted above, a thermal insulating compound 99 is placed on the top surface of the temperature sensitive circuit elements 54 prior to the encapsulation operation to aid in the protection of them from the heat of the press 12. For additional thermal protection, it is desirable to provide localized cooling of the top plate 60 of support 22 in those areas located immediately beneath the circuit elements 54. Additionally, the encapsulation process may be enhanced by heating areas of the top plate 60 which are spaced from the thermally sensitive circuit elements 54. The support 22 provides such localized heating and cooling as follows.

For purposes of the present discussion, and with reference initially to FIGS. 4 and 6, a single conduit 66 including pipes 68 and 70 is shown. It should be understood that the following discussion describing the manner in which cold fluid or hot fluid is supplied to conduit 66 applies equally to all of the other conduits 66 mounted within the support 22. One of the 3-way valves 84 is connected to the inlet of pipe 70 of conduit 66 by a line 102, and one of the 3-way valves 86 is connected to the inlet of pipe 68 of conduit 66 by a line 104. The 3-way valve 84 is also connected to the hot fluid source 78 through a line 106, and the 3-way valve 86 is connected to the cold fluid source 72 by a line 108. In order to circulate cold fluid through the conduit 66, and into contact with the underside of the top plate 60 immediately above the conduit 66, the controller 56 inputs a signal through line 110 to activate the pump 74 so that it begins pumping cold fluid from the source 72 into the distribution manifold 76. The operation of pump 80 is governed by the controller 56 via signals input through line 112, as described below in connection with a discussion of FIG. 5. The cold fluid passes from the pump 74 into the distribution manifold 76 and then to the inlet of each of the 3-way valves 84. It should be understood that the three valves 84 and three valves 86 shown in FIG. 6 are for purposes of illustration, and there could be essentially any number of valves 84, 86 depending on how many conduits 66 are employed in the support 22.

As best seen in FIG. 4, flow of cold fluid or heated fluid into each individual conduit 66 is dependent on the operation of a valve pair, i.e. one of the 3-way valves 84 and one of the 3-way valves 86. Once the position of the thermally sensitive circuit elements 54 on the top plate 60 of support 22 is determined, the group(s) of conduits 66, or individual conduits 66, which are located immediately beneath such areas are identified. The controller 56 is operative to introduce cold fluid into such conduit(s) 66 as follows. A signal is input to 3-way valve 84 though a line 114 which opens a path through 3-way valve 84 to the line 102 connected to the inlet of pipe 70, but closes the flow path to line 106 which connects such valve 84 to the hot fluid source 78. At the same time, the controller 56 inputs a signal through line 116 to the 3-way valve 86 connected to the pipe 68 associated with that conduit 66. The 3-way valve 86 is operated to permit the flow of fluid from pipe 68 into the line 108 connecting 3-way valve 86 to the cold fluid source 72, while closing the flow path through 3-way valve 86 from the distribution manifold 82. Consequently, cold fluid from the source 72 is pumped via pump 74 through the distribution manifold 76, to the 3-way valve 84, and then into the pipe 70 of conduit 66 via line 102. The cold fluid is directed by pipe 70 into the channel 64 formed on the underside of the top plate 60 where it contacts and reduces the temperature of a discrete area of the top plate 60 beneath one or more temperature sensitive circuit elements 54. See also FIG. 7. The cooling fluid passes through the channel 64 and enters the pipe 68 of conduit 66 from which it is discharged into the line 104 leading to the 3-way valve 86. The 3-way valve 86 passes the cold fluid into line 108 where it is transmitted back to the cold fluid source 72. The cold fluid is continuously recirculated along the above-described flow path, as depicted by arrows 118 in FIG. 4, throughout the encapsulation process to assist in protection of the temperature sensitive circuit elements 54 from thermal damage.

Other areas of the flex circuit 20 mount circuit elements 54 which are not affected by the temperature of the encapsulation process. In these areas, it is desirable to locally heat the top plate 60 of the support 22 to assist the press 12 with the encapsulation process. The same valve arrangement described in FIG. 4 is employed to deliver hot fluid to each individual conduit 66. With reference to FIGS. 5 and 6, in order to obtain a flow of hot fluid into the conduit 66 the controller 56 inputs a signal though line 112 to start the pump 80 connected to the hot fluid source 78. The hot fluid passes through the distribution manifold 82 to the inlet of each 3-way valve 86. The controller 56 inputs a signal through line 116 causing selected 3-way valves 86 to accept the flow of hot fluid from the distribution manifold 82 while closing the flow path from valve(s) 86 into line 108. The hot fluid passes through the 3-way valve 86 into line 104 which connects to the inlet of pipe 68 of conduit 66. At the same time, the controller 56 operates selected 3-way valves 84 to open a flow path through such valve(s) 84 from the line 102 connected to the pipe 70 of conduit 66 into line 106 extending between the valve(s) 84 and hot fluid source 78. The inlet of 3-way valve 84 connected to the distribution manifold 76 is closed. As a result, hot fluid from the source 78 and distribution manifold 82 passes through the 3-way valve 86 into the pipe 68 of conduit 66 via line 104, and moves along a channel 64 at the underside of top plate 60 thus locally heating the top plate 60 in that immediate area. The hot fluid enters the pipe 70 of conduit 66 from the channel 64 and is transmitted to the line 102. After passing through the 3-way valve 84, the hot fluid is returned to the source 78 through the line 106. The hot fluid is preferably continuously recirculated in the direction of arrows 120 in FIG. 5 throughout the encapsulation process.

The support 22 of this invention therefore provides localized heating and cooling of those areas of its top plate 60 where enhanced heat for encapsulation, or additional cooling to protect temperature sensitive circuit elements 54, is desired. Depending upon how the valve pair 84, 86 associated with each conduit 66 is operated, as described above, localized heating or cooling can be provided by each individual conduit 66 or groups of conduits 66, as needed. This allows for the efficient encapsulation of LCP circuits 20 of essentially any configuration, one after the other. The flow of hot or cold fluid through any given conduit 66 can be readily reversed by the controller 56, thus permitting the temperature of the area of the top plate 60 immediately above to be rapidly cooled if it was previously heated, or vice versa.

While the invention has been described with reference to a preferred embodiment, it should be understood by those skilled in the art that various changes may be made and equivalents substituted for elements thereof without departing from the scope of the invention. In addition, many modifications may be made to adapt a particular situation or material to the teachings of the invention without departing from the essential scope thereof.

For example, the views in FIGS. 4 and 5 depict lines 106 and 108 extending from the 3-way valves 84 and 86, respectively, directly to the respective fluid sources 78 and 72. It should be understood that additional distribution manifolds (not shown) could be provided between these lines 106, 108 and the sources 72 and 78, if desired.

Therefore, it is intended that the invention not be limited to the particular embodiment disclosed as the best mode contemplated for carrying out this invention, but that the invention will include all embodiments falling within the scope of the appended claims.

What is claimed is:

1. Apparatus for sealing circuit elements of an electrical circuit between a substrate upon which the circuit elements are mounted and a cover layer, at least some of the circuit elements on the substrate being temperature sensitive, said apparatus comprising:
   a press having a hollow interior adapted to be connected to a source of heated fluid, said press having an exposed surface that is heated by the heated fluid;
   a support which carries the substrate and the cover sheet, said support including:
   (i) a housing formed with a cavity and a plate having a first surface, said first surface of said plate supporting said substrate;
   (ii) a number of conduits mounted in said cavity, each of said conduits having a hollow interior that receives cooling fluid, said conduits each being located relative to at least one discrete area along said first surface of said plate so as to be effective to cool said at least one discrete area when cooling fluid is present within said hollow interior thereof;
   (iii) said plate having a second surface formed with a number of channels, said hollow interior of each of said conduits mounted in said cavity of said housing of said support including a first flow path and a second flow path communicating with one another through one of said channels formed in said second surface of said plate, one of said first and second flow paths forming an inlet adapted to receive cooling fluid from said source of cooling fluid and the other of said first and second flow paths forming an outlet adapted to return cooling fluid to said source of cooling fluid, the cooling fluid flowing though each of said conduits contacting one of said channels in said second surface of said plate and lowering the temperature of one of said discrete areas of said support in the course of movement along said first and second flow paths;
   a controller which is effective to direct cooling fluid into the hollow interior of individual ones of said conduits which are located at one or more discrete areas along said plate underlying the temperature sensitive circuit elements carried on the substrate, said individual ones of said conduits that receive cooling fluid providing localized cooling of said top plate and the temperature sensitive circuit elements at said discrete areas;
   said press, when at least partially filled with heating fluid, being movable relative to said support so that said exposed surface of said press contacts the cover sheet which overlies the substrate, said exposed surface of said press being effective to exert sufficient heat and pressure to cause the cover sheet and substrate to bond together while the heat sensitive circuit elements overlying said discrete areas of said top plate are cooled by said individual ones of said conduits receiving cooling fluid.

2. The apparatus of claim 1 in which said press is an iso-static press capable of exerting substantially equal pressure over the surface area of the cover sheet and substrate.

3. The apparatus of claim 1 in which said press includes a flexible membrane engageable with the cover sheet, said flexible membrane being formed of a material that substantially conforms to the shape of the circuit elements on the substrate in the course of movement into engagement with the cover sheet.

4. The apparatus of claim 1 further including thermal insulating compound located in between the temperature sensitive circuit elements and the cover sheet.

5. The apparatus of claim 1 in which said conduit includes a first pipe having a hollow interior defining said first flow path and a second pipe having a hollow interior defining said second flow path, an upper end of each of said first and second pipes being connected to one of said channels in said second surface of said plate.

6. The apparatus of claim 1 in which said conduits are adapted to connect to said source of heated fluid, said controller being effective to direct heated fluid into individual ones of said conduits which are located at one or more discrete areas along said plate that are spaced from the temperature sensitive circuit elements on the substrate.

7. The apparatus of claim 1 in which each of the substrate and the cover layer are formed of liquid crystal polymer.

8. Apparatus for sealing circuit elements of an electrical circuit between a substrate upon which the circuit elements are mounted and a cover layer, at least some of the circuit elements on the substrate being temperature sensitive, said apparatus comprising:
   a press having a hollow interior adapted to be connected to a source of heated fluid, said press having an exposed surface that is heated by the heated fluid;
   a support which carries the substrate and the cover sheet, said support including:
      (i) a housing formed with a cavity and a top plate having a first surface, said first surface of said top plate supporting said substrate;
      (ii) a number of conduits mounted in said cavity, each of said conduits having a hollow interior adapted to be connected to a source of heating fluid and to a source of cooling fluid, each of said conduits being located relative to a discrete area along said first surface of said plate so as to be effective to cool one of said discrete area when cooling fluid is present within said hollow interior thereof or to heat one of said discrete areas when heating fluid is present within said hollow interior thereof;
      (iii) each of said conduits mounted in said cavity including a first flow path communicating with a second flow path, said cooling fluid passing though each of said conduits in one direction along said first and second flow paths and said heating fluid passing through each of said conduits in the opposite direction along said first and second flow paths;
   a controller which is effective to direct cooling fluid into individual ones of said conduits which are located at one or more of said discrete areas underlying the temperature sensitive circuit elements carried by said substrate on said first surface of said plate, said individual ones of said conduits that receive cooling fluid providing localized cooling of said plate at said one or more discrete areas underlying the temperature sensitive circuit elements, said controller being effective to direct heating fluid into individual ones of said conduits which are located at one or more of said discrete areas that are spaced from the temperature sensitive circuit elements carried by said substrate on said first surface of said plate, said individual ones of said conduits that receive heating fluid providing localized heating of said top plate at said one or more discrete areas that are spaced from the temperature sensitive circuit elements;
   said press, when at least partially filled with heating fluid, being movable relative to said support so that said exposed surface of said press contacts the cover sheet which overlies the substrate, said press being effective to exert sufficient heat and pressure to cause the cover sheet and substrate to bond together while the heat sensitive circuit elements overlying said one or more discrete areas of said plate are cooled by said conduits receiving cooling fluid and one or more other discrete areas of said plate spaced from the heat sensitive elements are heated by said conduits receiving heating fluid.

9. The apparatus of claim 8 in which said conduits which receive heating fluid reach sufficient temperature to assist said press in causing the cover sheet and substrate to bond together.

10. The apparatus of claim 8 in which said press includes a flexible membrane engageable with the cover sheet, said flexible membrane substantially conforming to the shape of the circuit elements on the substrate in the course of movement into engagement with the cover sheet.

11. The apparatus of claim 8 further including a layer of thermal insulating compound located in between the temperature sensitive circuit elements and the cover sheet.

12. The apparatus of claim 8 in which each of said conduits mounted in said cavity of said housing of said support includes a first flow path communicating with a second flow path, one of said first and second flow paths of each conduit forming an inlet adapted to receive cooling fluid from a source of cooling fluid and the other of said first and second flow paths forming an outlet adapted to return cooling fluid to the source of cooling fluid, one of said first and second flow paths of each conduit forming an inlet adapted to receive heating fluid from a source of heating fluid and the other of said first and second flow paths forming an outlet adapted to return heating fluid to the source of heating fluid, said one of said first and second flow paths of each conduit which forms an inlet for cooling fluid forms an outlet for heating fluid and said other one of said first and second flow paths of each conduit which forms an outlet for cooling fluid forms an inlet for heating fluid.

13. The apparatus of claim 12 in which said conduit includes a first pipe having a hollow interior defining said first flow path and a second pipe having a hollow interior defining said second flow path, said second surface of said top plate of said support being formed with a channel connected to an upper end of each of said first and second pipes, said channel interconnecting said hollow interiors of said first and second pipes.

14. The apparatus of claim 8 further including:
   a first pump located between a source of cooling fluid and a first manifold;
   a first line connected between said first manifold and each of said conduits, and a first 3-way valve mounted in each of said first lines;
   a second pump located between a source of heating fluid and a second manifold;
   a second line connected between said second manifold and each of said conduits, and a second 3-way valve mounted in each of said second lines;
   a first return line connected between each of said first 3-way valves and said source of heating fluid, and a second return line connected between each of said second 3-way valves and said source of cooling fluid;
   said controller being operative to activate said first pump and selected pairs of first and second 3-way valves to form a flow path for cooling fluid from said source of cooling fluid, through said fast manifold and first 3-way valve to said conduit, and then out of said conduit, into said second line, through said second 3-way valve of a valve pair and to said second return line connected to said source of cooling fluid;

said controller being operative to activate said second pump and selected pairs of first and second 3-way valves to form a flow path for heating fluid from said source of heating fluid through said second manifold and second 3-way valve to said conduit, and then out of said conduit, into said first line, through said first 3-way valve of said valve pair and to said first return line connected to said source of heating fluid.

15. The apparatus of claim 8 in which each of the substrate and the cover layer are formed of liquid crystal polymer.

16. Apparatus for sealing circuit elements of an electrical circuit between a substrate upon which the circuit elements are mounted and a cover layer, said apparatus comprising:

a press having a hollow interior, said press being adapted to be connected to a source of heated fluid;

a support which carries the substrate and the cover sheet, at least some of the circuit elements on the substrate being temperature sensitive, said support including:
  (i) a housing formed with a cavity;
  (ii) a number of conduits mounted in said cavity, each of said conduits having a hollow interior adapted to be connected to the source of heated fluid and to a source of cooling fluid;
  (iii) each of said conduits including a first flow path communicating with a second flow path, said cooling fluid passing through each of said conduits in one direction along said first and second flow paths and said heating fluid passing through each of said conduits in the opposite direction along said first and second flow paths;

a controller which is effective to direct cooling fluid from the source of cooling fluid into those of said conduits which are located in position underlying the temperature sensitive circuit elements on the substrate and to direct heating fluid from the source of heating fluid into those of said conduits which are spaced from the temperature sensitive circuit elements on the substrate;

whereby said press when at least partially filled with heating fluid moves into contact with the cover sheet overlying the substrate and exerts sufficient heat and pressure to cause the cover sheet and substrate to bond together while the heat sensitive circuit elements are cooled by said conduits receiving cooling fluid.

17. Apparatus for sealing circuit elements of an electrical circuit between a substrate upon which the circuit elements are mounted and a cover layer, said apparatus comprising:

a press having a hollow interior, said press being adapted to be connected to a source of heated fluid;

a support which carries the substrate and the cover sheet, at least some of the circuit elements on the substrate being temperature sensitive, said support including:
  (i) a housing formed with a cavity;
  (ii) a number of conduits mounted in said cavity, each of said conduits having a hollow interior adapted to be connected to the source of heated fluid and to a source of cooling fluid;
  (iii) each of said conduits including a first flow path communicating with a second flow path, one of said first and second flow paths of each conduit forming an inlet adapted to receive cooling fluid from said source of cooling fluid and the other of said first and second flow paths forming an outlet adapted to return cooling fluid to the source of cooling fluid, one of said first and second flow paths of each conduit forming an inlet adapted to receive heating fluid from said source of heating fluid and the other of said first and second flow paths forming an outlet adapted to return heating fluid to the source of heating fluid, said one of said first and second flow paths of each conduit which forms an inlet for cooling fluid forms an outlet for healing fluid and said other one of said first and second flow paths of each conduit which forms an outlet for cooling fluid forms an inlet for heating fluid;

a controller which is effective to direct cooling fluid from the source of cooling fluid into those of said conduits which are located in position underlying the temperature sensitive circuit elements on the substrate, and to direct heating fluid from the source of heating fluid into those of said conduits which are spaced from the temperature sensitive circuit elements on the substrate;

whereby said press when at least partially filled with heating fluid moves into contact with the cover sheet overlying the substrate and exerts sufficient heat and pressure to cause the cover sheet and substrate to bond together while the heat sensitive circuit elements are cooled by said conduits receiving cooling fluid.

18. The apparatus of claim 17 in which said conduit includes a first pipe having a hollow interior defining said first flow path and a second pipe having a hollow interior defining said second flow path, said support including a top plate formed with a channel connected to an upper end of each of said first and second pipes, said channel interconnecting said hollow interiors of said first and second pipes.

19. Apparatus for sealing circuit elements of an electrical circuit between a substrate upon which the circuit elements are mounted and a cover layer, said apparatus comprising:

a press having a hollow interior, said press being adapted to be connected to a source of heated fluid;

a support which carries the substrate and the cover sheet, at least some of the circuit elements on the substrate being temperature sensitive, said support including:
  (i) a housing formed with a cavity;
  (ii) a number of conduits mounted in said cavity, each of said conduits having a hollow interior adapted to be connected to the source of heated fluid and to a source of cooling fluid;

a first pump located between said source of cooling fluid and a first manifold;

a first line connected between said first manifold and each of said conduits, and a first 3-way valve mounted in each of said first lines;

a second pump located between said source of heating fluid and a second manifold;

a second line connected between said second manifold and each of said conduits, and a second 3-way valve mounted in each of said second lines;

a first return line connected between each of said first 3-way valves and said source of heating fluid, and a second return line connected between each of said second 3-way valves and said source of cooling fluid;

a controller which is effective to activate said first pump and selected pairs of first and second 3-way valves to form a flow path for cooling fluid from said source of cooling fluid, through said first manifold and first 3-way valve to those of said conduits which are located in position underlying the temperature sensitive circuit elements on the substrate, and then out of said conduits, into said second line, through said second 3-way valve of a valve pair and to said second return line connected to said source of cooling fluid;

said controller being effective to activate said second pump and selected pairs of first and second 3-way valves to form a flow path for heating fluid from said source of heating fluid through said second manifold and second 3-way valve to those of said conduits which are spaced from the temperature sensitive circuit elements on the substrate, and then out of said conduits, into said first line, though said first 3-way valve of said valve pair and to said first return line connected to said source of heating fluid;

whereby said press when at least partially filled with heating fluid moves into contact with the cover sheet overlying the substrate and exerts sufficient heat and pressure to cause the cover sheet and substrate to bond together while the heat sensitive circuit elements are cooled by said conduits receiving cooling fluid.

\* \* \* \* \*